United States Patent
Hoshi et al.

(10) Patent No.: US 6,632,411 B2
(45) Date of Patent: Oct. 14, 2003

(54) SILICON WAFER AND METHOD FOR PRODUCING SILICON SINGLE CRYSTAL

(75) Inventors: Ryoji Hoshi, Fukushima (JP); Izumi Fusegawa, Fukushima (JP); Tomohiko Ohta, Fukushima (JP); Shigemaru Maeda, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/979,519
(22) PCT Filed: Mar. 27, 2001
(86) PCT No.: PCT/JP01/02451
§ 371 (c)(1), (2), (4) Date: Nov. 23, 2001
(87) PCT Pub. No.: WO01/73169
PCT Pub. Date: Oct. 4, 2001

(65) Prior Publication Data
US 2002/0157598 A1 Oct. 31, 2002

(30) Foreign Application Priority Data
Mar. 29, 2000 (JP) ............................................ 2000-92337

(51) Int. Cl.$^7$ .......................... C30B 15/02; C01B 33/26
(52) U.S. Cl. ......................... 423/328.2; 117/13; 117/19; 117/20
(58) Field of Search .................. 117/13, 19, 20

(56) References Cited

U.S. PATENT DOCUMENTS

| 6,197,109 B1 | * | 3/2001 | Iida et al. ...................... 117/19 |
| 6,299,982 B1 | * | 10/2001 | Tamatsuka et al. ......... 428/446 |
| 6,365,461 B1 | * | 4/2002 | Asayama et al. ........... 438/268 |

FOREIGN PATENT DOCUMENTS

| JP | 8-330316 A | 12/1996 |
| JP | 11-116391 A | 4/1999 |
| JP | 11-349393 A | 12/1999 |

OTHER PUBLICATIONS

"The Effect Of Nitrogen On The Grown-in Defect Formation In CZ Silicon Crystals" by Kozo Nakamura et al., pp. 116–139.

"Global Modelling Of Heat Transfer In Crystal Growth Furnaces" by F. Dupret et al., Int. J. Heat Mass Transfer. vol. 33, No. 9, pp. 1849–1871, 1990.

* cited by examiner

Primary Examiner—Felisa Hiteshew

(57) ABSTRACT

The present invention provides a silicon wafer sliced from a silicon single crystal ingot grown by the Czochralski method under such conditions that V-rich region should become dominant, wherein count number of particles having a size of 0.1 μm or more is 1 count/cm$^2$ or less when particles are counted by using a particle counter and a method for producing a silicon single crystal. Thus, there is provided a production technique that can improve productivity and reduce cost for high quality silicon wafers of excellent device characteristics by further reducing density and size of defects such as COP.

20 Claims, 4 Drawing Sheets

SILICON WAFER AND METHOD FOR PRODUCING SILICON SINGLE CRYSTAL

TECHNICAL FIELD

The present invention relates to a high quality silicon wafer used as a substrate of semiconductor devices such as memories, a single crystal for producing the same and a method for producing a single crystal.

BACKGROUND ART

An example of silicon single crystal pulling apparatus based on the Czochralski method (CZ method) is shown in FIG. 6. This silicon single crystal pulling apparatus comprises a quartz crucible 5 filled with silicon melt 4, a graphite crucible 6 that protects the quartz crucible 5, a heater 7 that is disposed so as to surround the crucibles 5 and 6, and a heat insulating material 8, which are disposed in a main chamber 1, and a pulling chamber 2 for accommodating and taking out a grown single crystal 3 is continuously provided on the main chamber 1 To grow the single crystal 3 by using such a production apparatus, a seed crystal is immersed into the silicon melt 4 in the quartz crucible 5, and then, after necking, carefully pulled with rotation to grow the rod-like single crystal 3. The crucibles 5 and 6 can be moved upwardly or downwardly along the crystal growth axis, and the crucibles are elevated so as to compensate the depression of liquid surface of the melt decreased due to crystallization during the crystal growth, thereby maintaining the height of the melt surface to be constant. Further, into the main chamber 1, an inert gas such as argon gas is introduced from a gas inlet 10 provided at an upper part of the pulling chamber 2, passed through a space between the single crystal 3 under pulling and a gas flow guide cylinder 11 and a space between a lower portion of a heat shielding member 12 and the melt surface, and then discharged from a gas outlet 9.

A large amount of silicon single crystals produced by the aforementioned CZ method are used for semiconductor devices. On the other hand, with use of higher integration degree of semiconductor devices, the devices increasingly become finer, and a size of 0.13 to 0.18 μm is used as a design rule in the latest devices. The use of such finer devices as described above makes the demand for quality of silicon single crystals severer, and the size of crystal defects causing problems also become smaller. If the defect size is smaller than the design rule, a defect will not exist over a plurality of devices, and therefore a device isolation can be surely performed. Moreover, since smaller defects are more likely to be eliminated during the device production process, and therefore less adversely affect on the devices. The size of crystal defect observed as COP (Crystal Originated Particle, defect originated in crystal and observed as a particle after SC1 cleaning) causing problems is currently considered 0.12 μm or more. Therefore, it has become important to reduce defects having a size of 0.1 μm or more as much as possible.

For the reference of the explanation of those defects, there will be given first general knowledge of factors determining densities of defects introduced into silicon single crystals, a void type point defect called vacancy (occasionally abbreviated as V hereinafter), and an interstitial type silicon point defect called interstitial silicon (occasionally abbreviated as I hereinafter).

In a silicon single crystal, a V-region means a region of which F/G is larger than that of a region suffering from the generation of OSFs and which contains many vacancies, i.e., depressions, pits and so forth generated due to lack of silicon atoms, and an I-region means a region containing many dislocations and aggregations of excessive silicon atoms generated due to the presence of excessive amount of silicon atoms. Between the V-region and the I-region, there should be a neutral region (occasionally abbreviated as N-region hereinafter) with no (or little) shortage or no (or little) surplus of the atoms. It has become clear that grown-in defects (FPD, LSTD, COP etc.) should be generated strictly only with supersaturated V or I, and they would not be present as defects even though there is little unevenness of atoms so long as V or I is not saturated.

It is known that the densities of these two kinds of point defects are determined by the relationship between the crystal pulling rate (growing rate) and the temperature gradient G in the vicinity of the solid-liquid interface in the crystal in the CZ method. Further, it has been confirmed that defects distributed in a ring shape called OSF (Oxidation Induced Stacking Fault) are present in the N-region between the V-region and the I-region.

Those defects generated during the crystal growth are categorized as follows. For example, when the growth rate is relatively high, i.e., around 0.6 mm/min or higher, grown-in defects considered to be originated from voids, i.e., aggregations of void-type point defects, such as FPD, LSTD and COP are distributed over the entire plane of the crystal along the radial direction at a high density and degrade the oxide film characteristics. A region containing such defects is called V-rich region. When the growth rate is 0.6 mm/min or lower, Interstitial becomes dominant and the aforementioned OSF ring is initially generated at the circumferential part of the crystal with the decrease of the growth rate, and L/D (large dislocations, also called interstitial dislocation loop, which includes LSEPD, LFPD and so forth), which are considered to be originated from dislocation loops, are present outside the ring at a low density and cause serious failure such as leakage. A region containing such defects is called I-rich region. When the growth rate is further lowered to around 0.4 mm/min, the OSF ring shrinks toward the center of wafer and disappears, and thus the entire plane becomes the I-rich region.

As a method for producing a single crystal that can provide good defect characteristics, there is, for example, a technique disclosed in Japanese Patent Laid-open (Kokai) Publication No. 8-330316, in which incorporation of point defects is controlled. While a crystal is generally grown with growth conditions that make the V-rich region dominant, it is grown in the N-region that is an intermediate region in which the either kind of the point defects is not dominant in the disclosed technique mentioned above. It is said that a crystal free from COPs and so forth can be produced according to this method.

However, the crystal growth rate becomes 0.5 mm/min or less, which is markedly lower than a rate of about 1 mm/min used for usual crystals. Thus, the productivity is degraded and the cost will become higher. Further, the N-region suffers from a drawback that it is likely to cause non-uniform oxygen precipitation.

Meanwhile, Japanese Patent Laid-open Publication No. 11-116391 discloses a method that does not elicit the incorporated void-type point defects by preventing them from growing to a large size. In this technique, it is attempted to decrease COP defects by shortening the period of passing a temperature region of 1150° C. to 1080° C., in which the point defects considered to agglomerate and grow into COPs. However, it is not considered that the defects are sufficiently reduced by this disclosed technique, since there remain about 10 count/cm² or less of particles having a size of 0.10 μm or more.

DISCLOSURE OF THE INVENTION

In view of the aforementioned problems of the conventional techniques, an object of the present invention is to provide a production technique that can improve productivity and reduce cost for high quality silicon wafers of excellent device characteristics that sufficiently meet recent devices having a line width of 0.13 to 0.18 μm by further reducing density and size of defects such as COP.

In order to achieve the aforementioned object, the silicon wafer according to the present invention is a mirror surface silicon wafer sliced from a silicon single crystal ingot grown by the Czochralski method under such conditions that V-rich region should become dominant, wherein a count number of particles having a size of 0.1 μm or more is 1 count/cm² or less when particles are counted by using a particle counter.

The mirror surface silicon wafer sliced from a silicon single crystal ingot grown by the Czochralski method under such conditions that V-rich region should become dominant and having a count number of 1 count/cm² or less for particles having a size of 0.1 μm or more according to the present invention as described above has very small defects and a low defect density. Therefore, besides it is a high quality silicon wafer showing excellent device characteristics that can satisfactorily meet to recent devices, it can be obtained with a low cost, since it is grown at a high rate in V-rich region.

In this case, the count number of particles having a size of 0.1 μm or more is preferably 0.1 count/cm² or less.

According to the present invention, there can be provided a wafer having an extremely low defect density, i.e., a count number of 0.1 count/cm² or less for particles having a size of 0.1 μm or more, as described above.

The method for producing a silicon single crystal according to the present invention is a method wherein, when a silicon single crystal is grown by the Czochralski method, the crystal is grown with a time L/F (min) of 0.28/(F/G–0.225)² min or less for passing a temperature region of from 1150° C. to 1080° C. and F/G of 0.22 mm²/K·min or more, which are calculated from a temperature gradient G (K/mm) at a crystal center along a crystal pulling axis direction from the melting point of silicon to 1400° C., a length L (mm) of the temperature region of from 1150° C. to 1080° C. and a crystal growth rate F (mm/min)

If a crystal is grown with a defined F/G value and passage time for the temperature region of 1150° C. to 1080° C. as described above, the total amount of introduced vacancies that form COP defects can be made few, and COP defect size can be limited to a small size by shortening the passage time. Thus, the good yields for device characteristics and oxide dielectric breakdown voltage characteristics are also improved and a silicon single crystal and wafer having an extremely low defect density for the whole plane can be stably produced while maintaining a high productivity.

In this case, a crystal is desirably grown with a time L/F of 40 min or less for passing the temperature region of from 1150° C. to 1080° C. and F/G of 0.27 mm²/K·min or less.

With such conditions, more stable extremely low defect density can be achieved.

Further, in the production of a silicon single crystal according to the present invention, it can be doped with nitrogen.

By doping with nitrogen as described above, the COP size can be further reduced compared with a case without doping.

In this case, nitrogen concentration to be doped is preferably 1×10¹⁵ number/cm³ or less.

This is because, in such a nitrogen concentration range, OSFs are not generated and COP defect size can further be effectively reduced by the intentional nitrogen doping.

According to the present invention, there are further provided a silicon single crystal grown by the aforementioned production method in which density and size of defects such as COPs are further reduced, and a high quality silicon wafer sliced from the aforementioned silicon single crystal.

As explained above in detail, according to the crystal growth conditions of the present invention, both of density and size of defects such as COPs in a silicon crystal can be decreased, and there can be provided a high quality silicon wafer having extremely few defects, which does not adversely affect device characteristics, oxide dielectric breakdown voltage characteristics and so forth. Furthermore, a crystal that does not generate defects of a size that poses a problem on the device production can be produced at a crystal growth rate comparable to or faster than that conventionally used, and thus improvement of productivity and cost reduction can be attained.

BEST MODE FOR CARRYING OUT THE INVENTION

The present invention will be explained in detail hereafter, but the present invention is not limited by the followings.

According to the design rule used for the latest devices at present, the COP size causing problems is considered to be about 0.12 μm or more. Therefore, it is important to reduce particles having a size of 0.12 μm or more.

Figure 1:
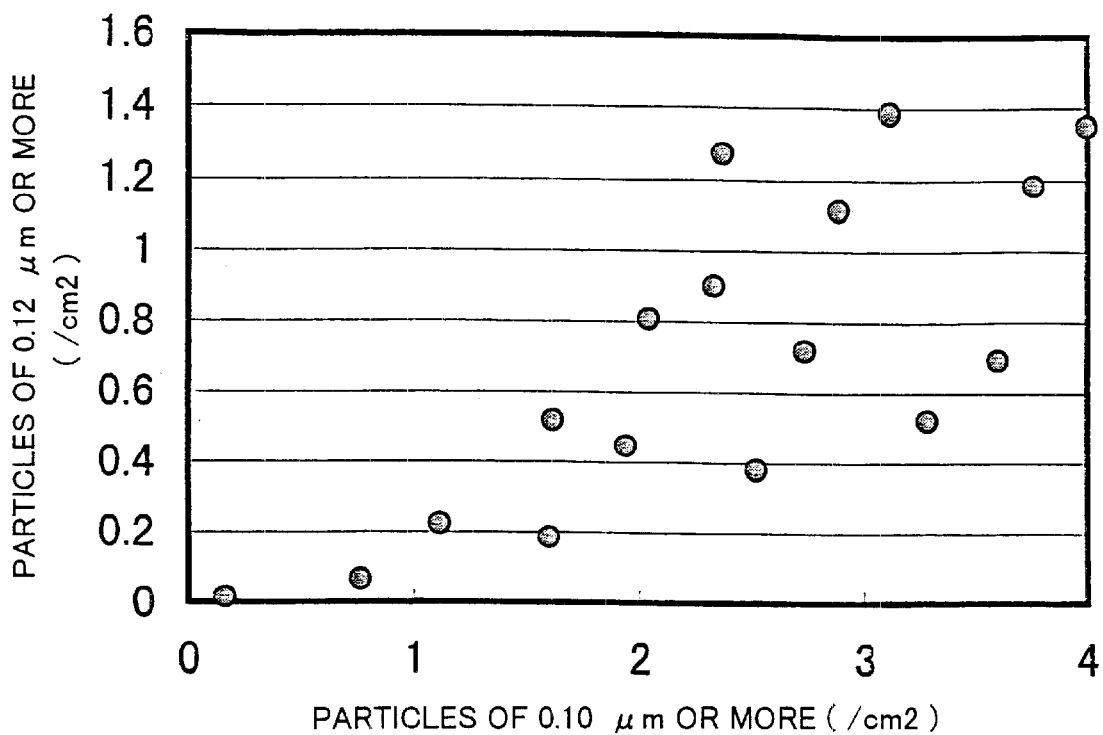
FIG. 1 is a graph showing relationship between number of particles having a size of 0.10 μm or more and number of particles having a size of 0.12 μm or more.

Therefore, numbers of particles having a size of 0.10 μm or more and numbers of particles having a size of 0.12 μm or more were measured by using a particle counter SP1 for silicon wafers obtained by slicing single crystals produced under various production conditions that made the V-rich region dominant and subjected to SC1 cleaning, and correlation between them was examined. As a result, it was found that, if the number of particles having a size of 0.10 μm or more is 1 count/cm$^2$ or less, particles having a size of 0.12 μm or more were scarcely observed as shown in FIG. 1.

SC1 is an alkaline cleaning mixture of $H_2O$—$H_2O_2$—$NH_4OH$ (5:1:1) series, and it has a strong action for removing organic contaminants and metal impurities. SP1 refers to a particle counter produced by KLA-Tencor Corporation, Surfscan SP1.

Thus, it was found that a mirror surface silicon wafer sliced from a crystal produced with pulling conditions that made the V-rich region dominant and finished by the SC1 cleaning would be a silicon wafer of high quality excellent in device characteristics and oxide dielectric breakdown voltage characteristics, if it is a silicon wafer having particles of extremely small size at a low particle density, i.e., a count number of 1 count/cm$^2$ or less for particles having a size of 0.10 μm or more counted by using a particle counter of SP1, LS-6030 (trade name of Hitachi Electronics Engineering Co., Ltd.) or the like.

Further, considering that further finer devices will be used in future, preferred will be silicon wafers and crystals therefor showing a count number of 0.1 count/cm$^2$ or less for particles having a size of 0.10 μm or more. Such wafers can be obtained by slicing a crystal grown under pulling conditions that make the V-rich region dominant according to the present invention.

The count number of particles is defined herein to be 0.1 count/cm$^2$ or less, because real particles are also present on a silicon wafer in addition to COPs. Their number is several to several tens for an 8-inch wafer (area: about 314 cm$^2$), while it depends on storage conditions. It is generally difficult to distinguish these real particles from COPs. Therefore, if the count is defined to be 0.1 count/cm$^2$ or less considering the number of real particles, the device characteristics and so forth can surely be improved.

In order to grow such a high quality silicon single crystal as described above, it is important to grow it under the crystal growth conditions described below.

The equilibrium concentration of intrinsic point defects in a crystal is a function of temperature, and the equilibrium concentration becomes higher as the temperature becomes higher. During the crystal growth, the temperature of crystal gradually decreases from the melting point. In this case, the equilibrium concentration of point defects sharply decreases, and therefore excessive point defects remain and agglomerate to form defects observed as COPs.

Therefore, in order to decrease COP defects having a large size, it can be conceived that (1) the concentration of excessive void-type point defects that serve as origin of COP defects should be decreased, (2) excessive void-type point defects should be prevented from growing large by extremely shortening the time to grow into COP defects that are secondary defects as much as possible and so forth.

In order to decrease the excessive void-type point defect as mentioned in (1), the temperature gradient G at the crystal growth interface and the crystal growth rate F must be taken into consideration. In connection with the temperature decrease from the melting point mentioned above, the excessive point defects are generated. The concentration of these excessive point defects becomes larger as the temperature becomes lower contrary to the equilibrium concentration. And the concentration difference of these excessive point defects serves as a driving force to discharge the excessive point defects into the melt side. As the temperature gradient becomes larger, this driving force becomes stronger. However, the temperature at which the point defects are discharged into the melt side is limited to a high temperature. Therefore, if the crystal growth rate becomes higher, the time that contributes to diffusion becomes shorter. Therefore, use of a higher crystal growth rate increases the amount of excessive point defects. Based on the aforementioned principles, it is considered that excessive point defect concentration increases in connection with increase of the growth rate, and decreases with increase of the temperature gradient. Therefore, the amount of excessive point defects roughly shows a value proportional to the F/G value, which is obtained from the growth rate F and the temperature gradient G near the melting point. Further, it is also known that the V-rich region is a region of which F/G value is larger than that of a region in which OSFs are generated.

On the other hand, in order to prevent the introduced void-type point defects from growing into a large size as mentioned in (2), it is considered to be effective to shorten the passage time L/F, which is obtained by dividing the length L of the temperature region of 1150° C. to 1080° C., in which the point defects considered to agglomerate and grow into COPs, with the growth rate F, as disclosed in Japanese Patent Laid-open Publication No. 11-116391.

Figure 2:
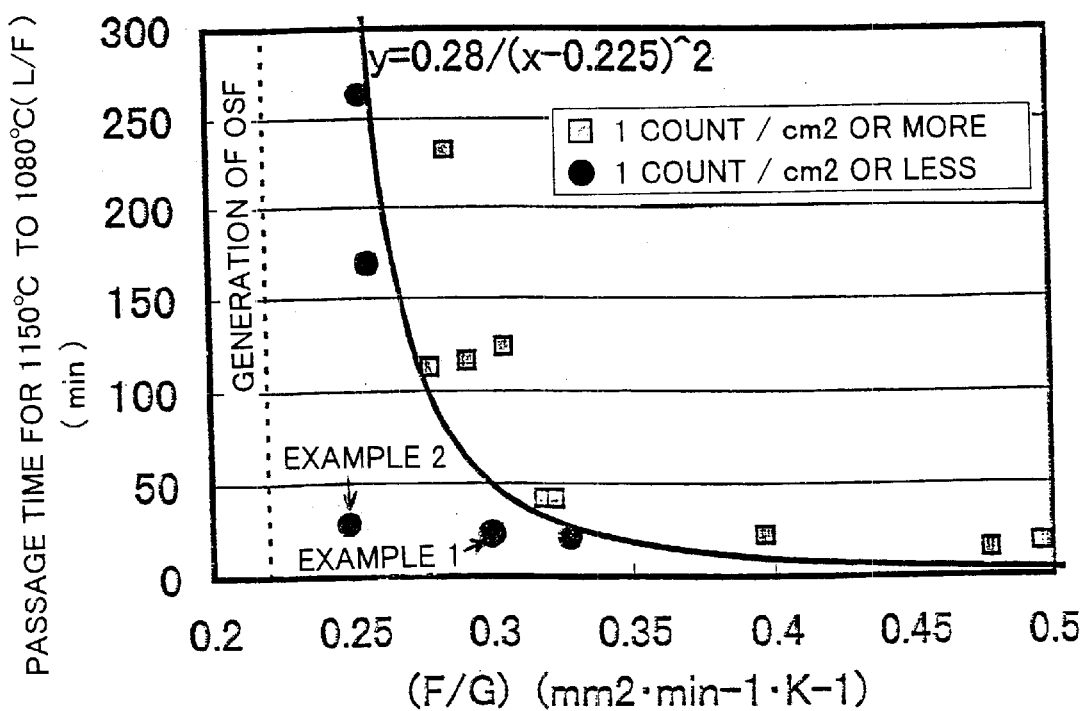
FIG. 2 is a graph used for determining the conditions that a particle density of particles having a size of 0.10 μm or more is 1 count/cm² or less, in which the time L/F for passing the temperature range of from 1150° C. to 1080° C. is plotted against F/G of various pulling conditions.

Crystals were grown with varying F/G and L/F by using various HZs (Hot Zone, it is also referred to as internal structure of furnace), and particles were measured for wafers sliced from the crystals. The results are shown in FIG. 2.

From this figure, it can be seen that, in order to produce a silicon wafer with a particle count of 1 count/cm$^2$ or less counted by a particle counter for particles having a size of 0.1 μm or more, as for the conditions for growing the silicon single crystal, the time L/F (min) for passing a temperature region of from 1150° C. to 1080° C. must be $0.28/(F/G-0.225)^2$ or less, which is calculated from a temperature gradient G (K/mm) at a crystal center from the melting point to 1400° C., a length L (mm) of the temperature region of from 1150° C. to 1080° C. and a crystal growth rate F (mm/min).

However, when the F/G value is 0.22 mm$^2$/K·min or less, the OSFs may be generated or the crystal is grown under the condition to have a region in which void-type point defects are not dominant, and therefore there is a risk that other problems may be caused, for example, failure due to OSFs, non-uniform oxygen precipitation and so forth. Therefore, the crystal growth method in which a crystal is grown under conditions that L/F is $0.28/(F/G-0.225)^2$ or less and F/G is 0.22 mm$^2$/K·min or more is important. However, a region of about 20 mm from the outermost periphery is excluded, since it becomes a region in which point defects are out-diffused and hence there are not generated secondary defects. That is, the condition for making the V-rich region dominant according to the present invention means such a condition that the V-rich region should become dominant in a region from the crystal center to the circle 20 mm distant from the outermost periphery.

Further, in order to obtain a small COP defect size and good quality, it is desirable that the time L/F for passing the temperature region of from 1150° C. to 1080° C. is 40 min or less and F/G is 0.22 mm$^2$/K·min or more but 0.27 mm$^2$/K·min or less.

Figure 3:
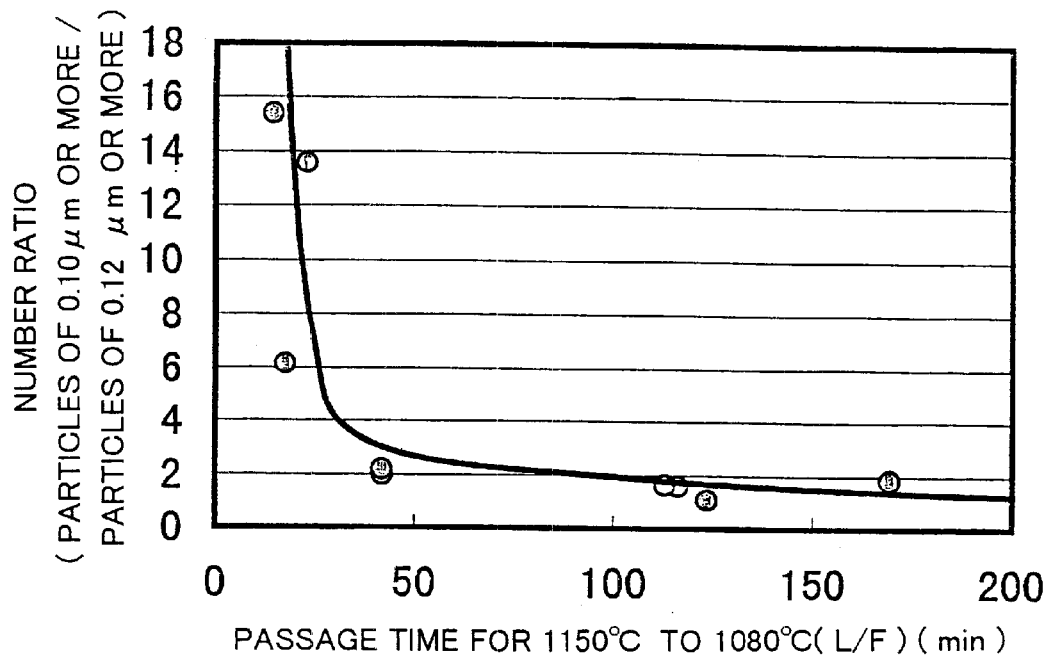
FIG. 3 is a graph showing relationship between the time L/F for passing the temperature range of from 1150° C. to 1080° C. and a ratio of densities of particles having a size of 0.10 μm or more and particles having a size of 0.12 μm or more.

It is described above that, in order to make the defect size small, it is necessary to shorten the time L/F for passing the temperature region of from 1150° C. to 1080° C. There are plotted this time in the horizontal axis and a ratio of number of particles having a size of 0.10 μm or more to number of particles having a size of 0.12 μm or more in the perpendicular axis in FIG. 3.

The plot indicates that, as the number ratio in the perpendicular axis becomes lager, small defects becomes more dominant, namely, the defect size becomes more likely to be smaller. From the graph of FIG. 3, it can be seen that the ratio of the numbers sharply becomes large in the region where L/F is 40 minutes or less. Therefore, in order to make the defect size small, L/F is preferably 40 minutes or less.

Figure 4:
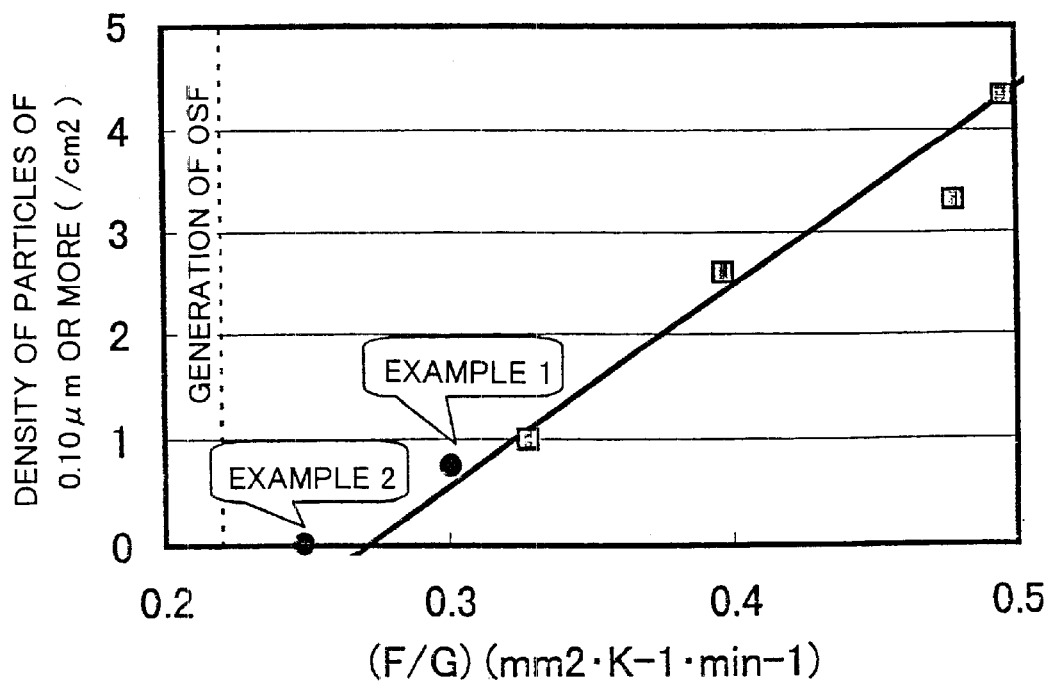
FIG. 4 is a graph showing relationship between F/G and density of particles having a size of 0.10 μm or more on the condition that the time L/F for passing the temperature range of from 1150° C. to 1080° C. is 40 min or less.

As for the growing conditions that satisfies the requirement that L/F is 40 minutes or less, a plot of F/G in the horizontal axis and the number of particles having a size of 0.10 μm or more in the perpendicular axis is shown in FIG. 4. From the graph of FIG. 4, it can be seen that, if F/G is smaller than 0.27, there are almost no COPs having a size of 0.10 μm or more. Therefore, under the growth conditions that L/F is 40 minutes or less and F/G is 0.22 mm$^2$/K·min or more but 0.27 mm$^2$/K·min or less, particularly good quality, i.e., a count number of 0.1 count/cm$^2$ or less for particles having a size of 0.10 μm or more can be obtained.

As the values of G and L used herein, there are used the values calculated by using the quasi-steady mode of global heat transfer analysis software FEMAG (F. Dupret, P. Nicodeme, Y. Ryckmans, P. Wouters, and M. J. Crochet, Int. J. Heat Mass Transfer, 33, 1849 (1990)). These values are changed if the parameters for the calculation such as heat conductivity of silicon are changed, and the calculation performed by the inventors of the present invention utilized parameters that met to the temperature distribution in a crystal during actual growing. Therefore, it is considered that different values may be obtained by calculation performed by others. However, the main point of the present invention resides in that L/F should be made small as much as possible and F/G should be made small as much as possible within a region where the V-rich region becomes dominant.

Furthermore, when a silicon single crystal is grown under the growing conditions described above, the crystal can be doped with nitrogen. If the crystal is intentionally doped with a micro amount of nitrogen, specifically, at a nitrogen concentration in the crystal of 1×10$^{15}$ number/cm$^3$ or less or such an amount that OSFs should not be observed on a surface of a silicon wafer after the wafer is subjected to an oxidation treatment at 1150° C. for 100 minutes in a wet O$_2$ atmosphere and then preferential etching for 8 μm with a mixed acid solution (hydrofluoric acid:nitric acid:acetic acid:water=1:15:3:5) having selectivity, the size of defects can be more reduced.

The inventors of the present invention found that, even when an extremely small amount of nitrogen such as about 1×10$^{10}$ number/cm$^3$ of nitrogen is added to a silicon single crystal, the COP size became smaller compared with a case where it was not added. It was also confirmed that this size reduction effect was enhanced with increase of the nitrogen concentration. However, if nitrogen is added, it becomes likely that OSFs are generated. Although it depended on the crystal growing conditions, OSFs were generated at an oxygen concentration of more than about 16 ppma (standard of Japan Electronic Industry Development Association, JEIDA) and a nitrogen concentration of about 1×10$^{13}$ number/cm$^3$, at a low oxygen concentration of more than about 10 ppma (JEIDA) and a nitrogen concentration of about 5×10$^{13}$ number/cm$^3$, and even at an extremely low oxygen concentration of about 5 ppma (JEIDA) or less and a nitrogen concentration of about 3×10$^{14}$ number/cm$^3$. Therefore, if nitrogen is intentionally doped at a concentration in such a range that OSFs should not be generated, the COP defect size can be effectively reduced. A wafer of high quality as described above can be obtained according to a silicon single crystal that is produced with such crystal growth conditions as described above and a wafer produced by slicing the crystal.

Hereafter, embodiments of the present invention will be explained in detail with reference to the drawings.

Figure 5:
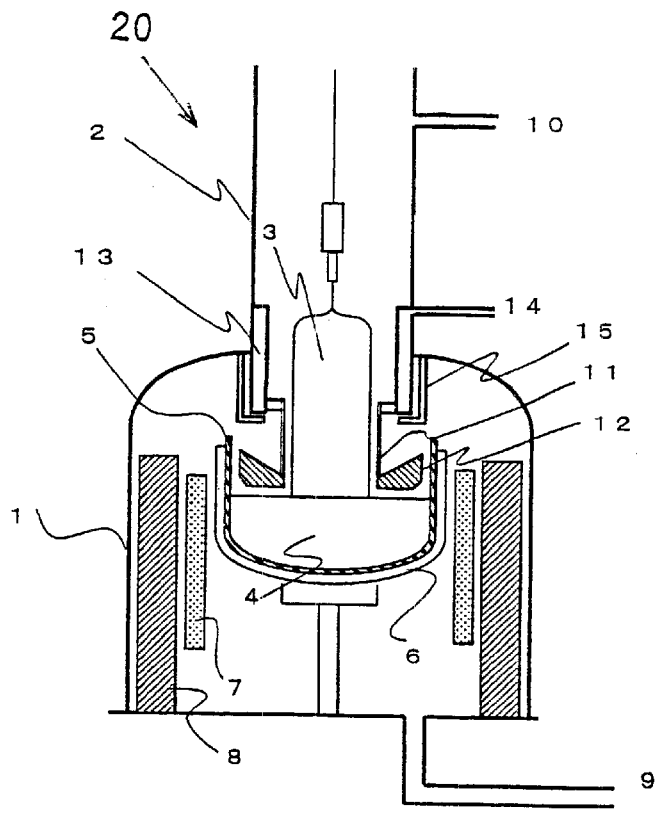
FIG. 5 is an explanatory view showing a CZ method single crystal pulling apparatus used for the present invention, which is provided with a cooling cylinder.

First, a schematic exemplary structure of a single crystal pulling apparatus based on the CZ method used for the present invention will be explained with reference to FIG. 5. As shown in FIG. 5, this apparatus 20 for pulling a single crystal comprises members for melting raw material silicon, mechanism for pulling crystallized silicon and so forth, and they are accommodated in a main chamber 1. A pulling chamber 2 extending upwardly is continuously provided from a ceiling portion of the main chamber 1, and a mechanism for pulling a single crystal 3 (not shown) is provided above it.

In the main chamber 1, a quartz crucible 5 for containing melted raw material melt 4 and a graphite crucible 6 for accommodating the quartz crucible 5 are provided, and these crucibles 5 and 6 are supported by a driving mechanism (not shown) so that they can be moved upwardly or downwardly. The driving mechanism for the crucibles elevates them for the reduced height of the melt surface so as to compensate the depression of melt surface caused in connection with pulling of a single crystal.

Further, a heater 7 for melting the raw material is provided so as to surround the crucibles 5 and 6, and a heat insulating member 8 for preventing the heat from the heater 7 from directly radiating the main chamber 1 is provided outside the heater 7 so as to surround the heater. An inert gas such as argon gas is introduced into the main chamber 1 from a gas inlet 10 provided at an upper part of the pulling chamber 2, passed through a space between the single crystal 3 under pulling and a gas flow guide cylinder 11 and a space between a lower portion of a heat shielding member 12 and the melt surface, and then discharged from a gas outlet 9. The internal structure of the furnace described above is substantially the same as that of a conventional apparatus.

In order to grow a single crystal of the present invention, the parameters of the growing conditions, L/F and F/G, both must be made small as described above. The growth rate F is used for the denominator of L/F and the numerator of F/G. Therefore, it cannot be significantly changed because the both parameters must be made small. Thus, L must be made small and G must be made large. To achieve this, rapid cooling in such a degree as not used in conventional techniques must be used. Therefore, the cooling cylinder 13 that can rapidly cool the growing crystal is disposed in the main chamber 1 and the heat shielding member 12 is provided below it as shown in FIG. 5, so that rapid cooling can be attained.

Into this cooling cylinder 13, a cooling medium is introduced from a cooling medium inlet 14, circulated in the cooling cylinder 13, and discharged outside. As the cooling medium, water is preferably used in view of cooling characteristics and economy. Further, the heat shielding member 12 composed of a material having high heat conductivity (graphite etc.) is used, and the heat absorbed by this member is conducted to the cooling cylinder 13 via an auxiliary cooling member 11 (graphite etc.) and discharged outside via the cooling medium so as to rapidly cool the single crystal. Furthermore, a protective cover 15 for cooling cylinder is provided outside the cooling cylinder 13 to prevent the melt scattered during the melting of the raw material from adhering to the cooling cylinder 13 and shield the radiant heat from the heater 7 and so forth.

Hereafter, the present invention will be explained more specifically with reference to examples of the present invention and comparative examples. However, the present invention is not limited to these.

EXAMPLE 1

A single crystal ingot was grown by using the single crystal pulling apparatus 20 shown in FIG. 5 mentioned above.

For HZ provided with a crucible having a diameter of 24 inches, G was calculated to be 3.66 K/mm and L to be 25.21 mm. To this crucible, 150 kg of polycrystal silicon was introduced and melted. A P-type single crystal having a diameter of 8 inches and a straight body length of about 120 cm was grown from the melted silicon at an average growth rate F for the straight body of 1.10 mm/min. Therefore, L/F was calculated to be 22.92 min and F/G to be 0.300 mm$^2$/K·min, which satisfied the growing conditions of the present invention. In this case, in order not to take an influence of convection into consideration, a horizontal magnetic field was applied so that an intensity at the magnetic field center should be 4000 gausses.

The obtained single crystal showed a resistivity of about 10 Ωcm and an oxygen concentration of about 15 ppma (JEIDA).

Figure 7:
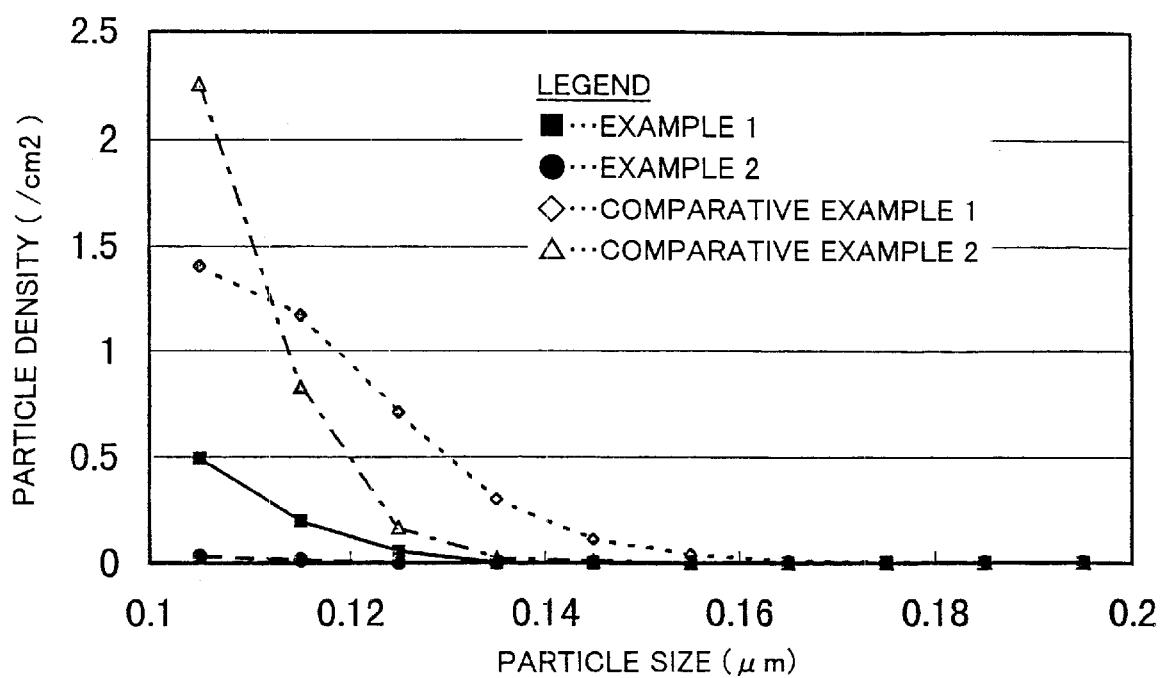
FIG. 7 is a graph showing particle size distributions of silicon wafers produced from the crystals obtained in Examples 1 and 2 and Comparative Examples 1 and 2.

A mirror surface silicon wafer produced by slicing the crystal was finished by SC1 cleaning, and then number of particles having a size of 0.10 μm or more was counted by using a particle counter SP1. As a result, a size distribution shown in FIG. 7 was obtained, and thus there was obtained a good wafer showing extremely smaller particle size and density compared with the size distribution described in Comparative Example 1 mentioned later. The total number of particles having a size of 0.10 μm or more of this wafer was 238 for the whole surface of the 8-inch wafer and the average density was 0.76/cm$^2$. Thus, it was a wafer of good quality.

EXAMPLE 2

A P-type single crystal having a diameter of 8 inches and a straight body length of about 120 cm was grown from 150 kg of melted silicon by using HZ showing the same conditions as used Example 1. In this case, the average growth rate F for the straight body was 0.91 mm/min, which was slightly slower than that of Example 1. Therefore, L/F was calculated to be 27.70 min and F/G to be 0.249 mm$^2$/K·min. This crystal also showed a resistivity of about 10 Ωcm and an oxygen concentration of about 15 ppma (JEIDA) as in Example 1. A horizontal magnetic field was applied so that an intensity at the magnetic field center should be 4000 gausses also in this case.

A mirror surface silicon wafer produced by slicing the above crystal was finished by SC1 cleaning, and then number of particles having a size of 0.10 μm or more was counted by using a particle counter SP1. As a result, a size distribution shown in FIG. 7 was obtained, and thus there was obtained a wafer showing further better particle size and density compared with the size distribution described in Example 1. The number of particles having a size of 0.10 μm or more of this wafer was 6 for the whole surface of the 8-inch wafer and the average density was 0.02/cm$^2$. Thus, a wafer of extremely good quality could be obtained.

EXAMPLE 3

A P-type single crystal having a diameter of 8 inches and a straight body length of about 120 cm was grown from 150 kg of melted silicon by using HZ showing the same conditions as used in Example 1 at the same average growth rate F for the straight body as Example 1, 1.10 mm/min. In this case, nitrogen was added so that the nitrogen concentration at a position at which a wafer was to be sliced should be 3×10$^{12}$ number/cm$^3$. This crystal also showed a resistivity of about 10 Ωcm and an oxygen concentration of about 15 ppma (JEIDA) as in Example 1. A horizontal magnetic field was applied so that an intensity at the magnetic field center should be 4000 gausses also in this case.

Even when a mirror surface silicon wafer produced by slicing the above crystal was subjected to an oxidation treatment at 1150° C. for 100 minutes in a wet O$_2$ atmosphere and then preferential etching for 8 μm with a mixed acid solution (hydrofluoric acid:nitric acid:acetic acid:water=1:15:3:5) having selectivity, OSFs were not observed on its surface. Further, number of particles having a size of 0.10 μm or more was counted by using a particle counter SP1. As a result, the number of particles having a size of 0.10 μm or more was 192 for the whole surface of the 8-inch wafer and the average density was 0.61/cm$^2$. Thus, the defect density could be further reduced compared with Example 1.

EXAMPLE 4

A P-type single crystal having a diameter of 8 inches and a straight body length of about 120 cm was grown from 150 kg of melted silicon by using HZ showing the same conditions as used in Example 1 but without applying a magnetic field. In this case, the average growth rate F for the straight body was 1.02 mm/min. Therefore, L/F was calculated to be 24.72 min and F/G to be 0.279 mm$^2$/K·min. This crystal showed a resistivity of about 10 Ωcm and an oxygen concentration of about 16 ppma (JEIDA).

A mirror surface silicon wafer produced by slicing the above crystal was finished by SC1 cleaning, and then number of particles having a size of 0.10 μm or more was counted by using a particle counter SP1. As a result, the number of particles having a size of 0.10 μm or more was 228 for the whole surface of the 8-inch wafer and the average density was 0.73/cm$^2$. Thus, a wafer of good quality could be obtained.

Comparative Example 1

Figure 6:
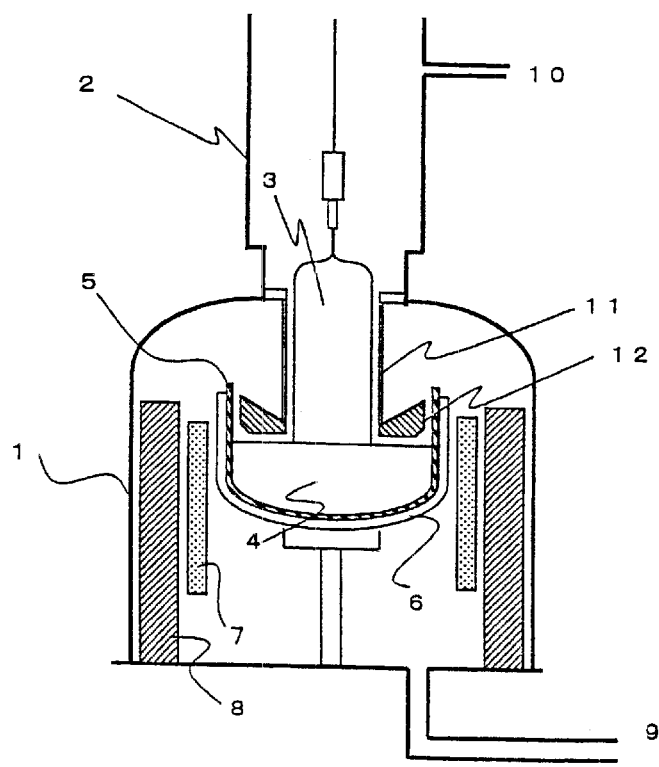
FIG. 6 is an explanatory view showing a conventional CZ method single crystal pulling apparatus.

A usual HZ such as one shown in FIG. 6 was prepared, in which a cooling cylinder was not used. For this HZ provided with a crucible having a diameter of 24 inches, G was calculated to be 3.04 K/mm and L to be 41.09 mm. To this crucible, 150 kg of polycrystal silicon was introduced and melted. A P-type single crystal having a diameter of 8 inches and a straight body length of about 120 cm was grown from the melted silicon at an average growth rate F for the straight body of 0.98 mm/min. Therefore, L/F was calculated to be 41.93 min and F/G to be 0.323 mm$^2$/K·min, which were out of the scope of the present invention. This crystal showed a resistivity of about 10 Ωcm and an oxygen concentration of about 15 ppma (JEIDA). A horizontal magnetic field was applied so that an intensity at the magnetic field center should be 4000 gausses also in this case for comparison.

A mirror surface silicon wafer produced by slicing the crystal was finished by SC1 cleaning, and then number of particles having a size of 0.10 μm or more was counted by using a particle counter SP1. As a result, a size distribution shown in FIG. 7 was obtained, and it can be seen that both of particle size and density were larger than those observed in the size distributions of Examples 1 and 2. The number of particles having a size of 0.10 μm or more of this wafer was 1181 for the whole surface of the 8-inch wafer and the average density was 3.76/cm². Thus, it was a wafer having more defects compared with that of the present invention.

Comparative Example 2

A P-type single crystal having a diameter of 8 inches and a straight body length of about 120 cm was grown from 150 kg of melted silicon by using HZ showing the same conditions as used in Example 1. In this case, the average growth rate F for the straight body was 1.75 mm/min, which was significantly faster than that of Example 1. Therefore, L/F was calculated to be 14.14 min and F/G to be 0.478 mm²/K·min, which were out of the scope of the present invention. This crystal also showed a resistivity of about 10 Ωcm as in Example 1 and an oxygen concentration of about 14 ppma (JEIDA). A horizontal magnetic field was applied so that an intensity at the magnetic field center should be 4000 gausses also in this case.

A mirror surface silicon wafer produced by slicing the crystal was finished by SC1 cleaning, and then number of particles having a size of 0.10 μm or more than was counted by using a particle counter SP1. As a result, a size distribution shown in FIG. 7 was obtained, and it can be seen that, while the COP size became smaller compared with Comparative Example 1, the particle density became larger than that observed in Example 1. The number of particles having a size of 0.10 μm or more was 1039 for the whole surface of the 8-inch wafer and the average density was 3.31/cm². Thus, it was a wafer having more defects compared with that of the present invention.

The present invention is not limited to the embodiments described above. The above-described embodiments are mere examples, and those having the substantially same configuration as that described in the appended claims and providing similar functions and advantages are included in the scope of the present invention.

For example, in the embodiments of the present invention, silicon single crystal ingots having a diameter of 200 mm (8 inches) were grown. However, the present invention also meets to recent large diameter wafers having a diameter of 250 mm (10 inches) to 400 mm (16 inches) or more.

Further, in the examples of the present invention, the MCZ method (Magnetic field applied Czochralski crystal growth method) was mainly explained, in which a magnetic field is applied during pulling of a silicon single crystal. However, the present invention is not limited to this, and it can of course be used for the usual Czochralski method, and the term of "Czochralski method" used in this specification includes both of the usual Czochralski method and the MCZ method.

What is claimed is:

1. A silicon wafer sliced from a silicon single crystal ingot grown by the Czochralski method under such conditions that a V-rich region should become dominant, wherein a count number of particles having a size of 0.1 μm or more is 1 count/cm² or less when particles are counted by using a particle counter.

2. The silicon wafer according to claim 1, wherein the count number of particles having a size of 0.1 μm or more is 0.1 count/cm² or less.

3. A method for producing a silicon single crystal, wherein, when a silicon single crystal is grown by the Czochralski method, the crystal is grown with a time L/F (min) of $0.28/(F/G-0.225)^2$ min or less for passing a temperature region of from 1150° C. to 1080° C. and F/G of 0.22 mm²/K·min or more, which are calculated from a temperature gradient G (K/mm) at a crystal center along a crystal pulling axis direction from the melting point of silicon to 1400° C., a length L (mm) of the temperature region of from 1150° C. to 1080° C. and a crystal growth rate F (mm/min).

4. The method for producing a silicon single crystal according to claim 3, wherein the crystal is grown with a time L/F of 40 min or less for passing the temperature region of from 1150° C. to 1080° C.

5. A silicon single crystal grown by the production method according to claim 4.

6. A silicon wafer produced by slicing the silicon single crystal according to claim 5.

7. The method for producing a silicon single crystal according to claim 3, wherein the crystal is grown with FIG of 0.27 mm²/K·min or less.

8. A silicon single crystal grown by the production method according to claim 7.

9. A silicon wafer produced by slicing the silicon single crystal according to claim 8.

10. The method for producing a silicon single crystal according to claim 3, wherein the crystal is doped with nitrogen.

11. The method for producing a silicon single crystal according to claim 10, wherein nitrogen concentration to be doped is $1 \times 10^{15}$ number/cm³ or less.

12. A silicon single crystal grown by the production method according to claim 11.

13. A silicon wafer produced by slicing the silicon single crystal according to claim 12.

14. A silicon single crystal grown by the production method according to claim 10.

15. A silicon wafer produced by slicing the silicon single crystal according to claim 14.

16. A silicon single crystal grown by the production method according to claim 3.

17. A silicon wafer produced by slicing the silicon single crystal according to claim 16.

18. A silicon wafer produced by slicing the silicon single crystal according to claim 17.

19. A silicon single crystal grown by the production method according to claim 16.

20. A silicon wafer produced by slicing the silicon single crystal according to claim 19.

* * * * *